(12) United States Patent
Lowney et al.

(10) Patent No.: US 9,432,036 B1
(45) Date of Patent: Aug. 30, 2016

(54) RADIO FREQUENCY CURRENT STEERING DIGITAL TO ANALOG CONVERTER

(71) Applicant: Xilinx, Inc., San Jose, CA (US)

(72) Inventors: Donnacha Lowney, Dublin (IE); Christophe Erdmann, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/847,405

(22) Filed: Sep. 8, 2015

(51) Int. Cl.
| | | |
|---|---|---|
| H03M 1/66 | (2006.01) | |
| H03M 1/00 | (2006.01) | |
| H03K 17/041 | (2006.01) | |
| H03K 19/21 | (2006.01) | |
| H03M 1/74 | (2006.01) | |

(52) U.S. Cl.
CPC ....... *H03M 1/002* (2013.01); *H03K 17/04106* (2013.01); *H03K 19/21* (2013.01); *H03M 1/66* (2013.01); *H03M 1/747* (2013.01)

(58) Field of Classification Search
CPC ...... H03M 1/002; H03M 1/747; H03M 1/66; H03K 17/04106; H03K 19/21
USPC ................................. 341/144, 136
See application file for complete search history.

(56) References Cited

U.S. PATENT DOCUMENTS

| | | | | |
|---|---|---|---|---|
| 8,704,606 B2 * | 4/2014 | Schimper | ................ | H04L 27/34 327/355 |
| 9,020,027 B2 * | 4/2015 | Staszewski | ........... | H03F 3/2176 330/10 |
| 9,024,796 B2 * | 5/2015 | Klepser | ................ | H04B 7/0413 341/144 |
| 9,143,155 B2 * | 9/2015 | Pfann | .................. | H03D 7/1466 |

OTHER PUBLICATIONS

Analog Devices, 11-/14-Bit, 5.6 GSPS, RF Digital-to-Analog Converter, AD9119/AD9129, Jan. 1, 2013, Rev. 0, pp. 1-68, Analog Devices, Inc., Norwood, Massachusetts, USA.
Engel, Gil et al., "A 14b 3/6GHz Current-Steering RF DAC in 0.18um CMOS with 66dB ACLR at 2.9GHz," Proc. of the 2012 IEEE International Solid-State Circuits Conference, Feb. 19, 2012, pp. 458-460, IEEE, Piscataway, New Jersey, USA.
Schafferer, Bernd, "A 3V CMOS 400mW 14b 1.4GS/s DAC for Multi-Carrier Applications," Proc. of the 2004 IEEE International Solid-State Circuits Conference, Feb. 15, 2004, pp. 1-10, IEEE, Piscataway, New Jersey, USA.
Zimmermann, Niklas, "Design of an RF-DAC in 65 nm CMOS for Multistandard, Multimode Transmitters," Proc. of the 2009 International Symposium on Radio-Frequency Integration Technology, Dec. 9, 2009, pp. 343-346, IEEE, Piscataway, New Jersey, USA.

* cited by examiner

*Primary Examiner* — Brian Young
(74) *Attorney, Agent, or Firm* — Robert M. Brush

(57) ABSTRACT

In one example, a current steering circuit for a digital-to-analog converter (DAC) includes a source-coupled transistor pair responsive to a differential gate voltage; a current source coupled to the source-coupled transistor pair operable to source a bias current; a load circuit coupled to the source-coupled transistor pair operable to provide a differential output voltage; a driver having a first input, a second input, and a differential output, the differential output providing the differential gate voltage; and combinatorial logic having a data input, a clock input, a true output, and a complement output, the true output and the complement output respectively coupled to the first input and the second input of the driver, the combinatorial logic operable to exclusively OR a data signal on the data input and a clock signal on the clock input.

20 Claims, 6 Drawing Sheets

US 9,432,036 B1

RADIO FREQUENCY CURRENT STEERING DIGITAL TO ANALOG CONVERTER

TECHNICAL FIELD

Examples of the present disclosure generally relate to electronic circuits and, in particular, to a radio frequency (RF) current steering digital-to-analog converter (DAC).

BACKGROUND

Digital-to-analog conversion is the process of converting digital (binary) codes into a continuous range of analog signal levels. Digital codes can be converted into analog voltage, analog current, or analog charge signals using a digital-to-analog converter (DAC). Some wireless applications require conversion of digital codes into an analog signal modulating a radio frequency (RF) carrier. In some systems, the analog output of a DAC is low-pass filtered to remove aliased components in the second and third Nyquist zones. The analog signal is then translated to a carrier frequency using a mixer. The output of the mixer can be filtered to remove one of the side bands. A power amplifier amplifies the remaining side band for transmission.

One type of DAC includes a plurality of current steering cells, where each current steering cell includes a number of switches coupled to a current source. One current steering cell architecture includes four switches so that there is constant switching activity on the drain of the current source regardless of the digital input code, resulting in code independent dynamic performance. However, such additional switches come at the expense of increased area and power.

SUMMARY

An RF current steering DAC is described. In an example, a current steering circuit for a digital-to-analog converter (DAC) includes a source-coupled transistor pair responsive to a differential gate voltage; a current source coupled to the source-coupled transistor pair operable to source a bias current; a load circuit coupled to the source-coupled transistor pair operable to provide a differential output voltage; a driver having a first input, a second input, and a differential output, the differential output providing the differential gate voltage; and combinatorial logic having a data input, a clock input, a true output, and a complement output, the true output and the complement output respectively coupled to the first input and the second input of the driver, the combinatorial logic operable to exclusively OR a data signal on the data input and a clock signal on the clock input.

In another example, a digital-to-analog converter (DAC) includes a decoder operable to output a data signal in response to binary input codes, and a plurality of output cells coupled between the decoder and a load circuit to provide an analog output signal centered at a carrier frequency. Each of the plurality of output cells includes a switch circuit coupled to the load circuit; a driver having an input and an output, the output operable to control the switch; and combinatorial logic having a data input operable to receive a respective bit of the data signal, a clock input operable to receive a clock signal, and an output, coupled to the input of the driver, the combinatorial logic operable to exclusively OR the data input and the clock input.

In another example, a method of digital-to-analog conversion includes generating a data signal in response to binary input codes; operating a plurality of output cells to provide an analog output signal centered at a carrier frequency, where each of the plurality of output cells is operated by: exclusively ORing a respective bit of the data signal and a clock signal to generate a control signal; and selectively driving a load circuit based on the control signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
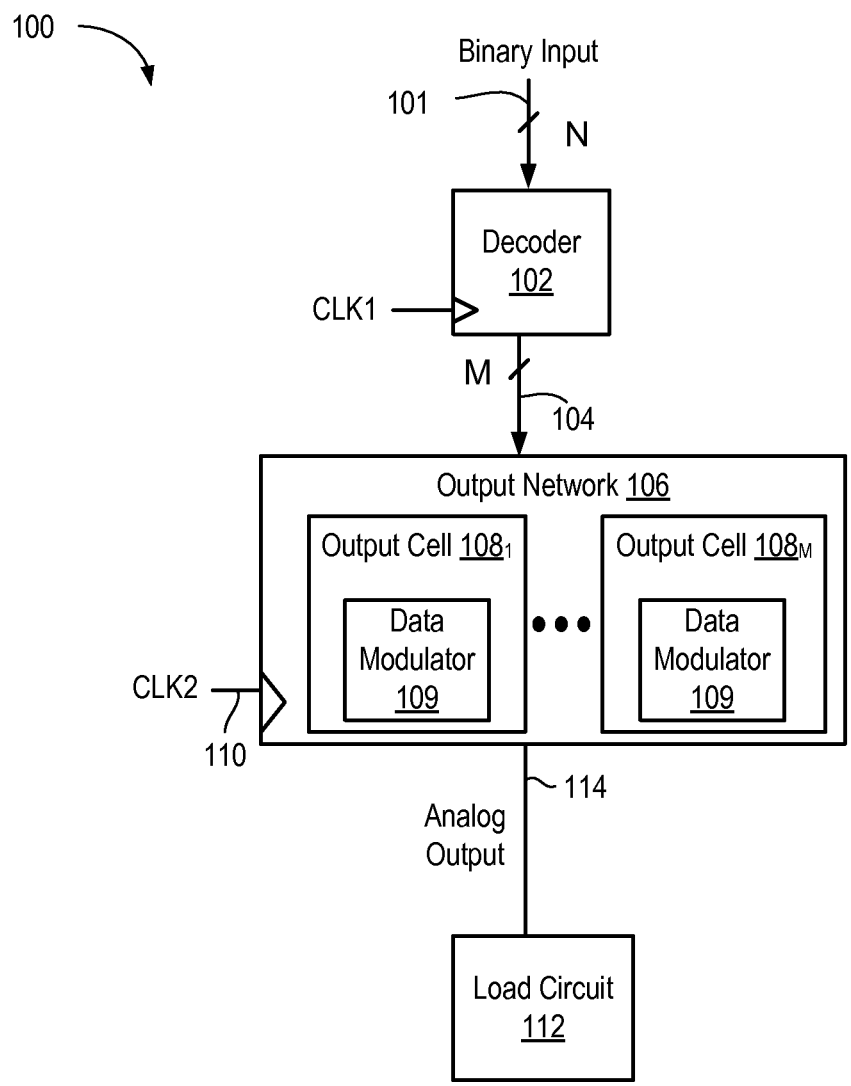
FIG. 1 is a block diagram depicting an example of a digital-to-analog converter (DAC).

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

An RF current steering DAC is described. In an example, a current steering cell in a DAC includes a source-coupled transistor pair responsive to a differential gate voltage. A current source is coupled to the source-coupled transistor pair and is operable to source a bias current. A driver is coupled to the source-coupled transistor pair to provide a differential gate voltage. Combinatorial logic is coupled to the driver. In a regular baseband mode of operation, the data passes through combinatorial logic to the driver without modification. In an RF mode of operation, the combinatorial logic is enabled to perform an exclusive OR of the data and the clock and the output is coupled to the driver. As such, an RF DAC can be implemented without the need for a mixer in the signal chain. Further, only a pair of transistor switches are needed for each current steering cell, which provides for less parasitic capacitance on the current source and an improvement in settling time as opposed to current steering cells having more than two switches. The switches, drivers, and combinatorial logic can all remain in the thin oxide domain, resulting in power and area savings. These and other aspects can be understood with reference to the following figures.

FIG. 1 is a block diagram depicting an example of a digital-to-analog converter (DAC) 100. The DAC 100 includes a decoder 102, an output network 106, and a load circuit 112. The decoder 102 includes an input 101 for receiving binary codes to be converted ("binary input"). The input 101 has a width of N bits for receiving N-bit binary codes. A clock port of the decoder 102 receives a clock signal "CLK". The decoder 102 includes an output 104 operable to provide a data signal as output. The decoder 102 outputs control codes to control the output network 106 based on the respective binary input. The decoder 102 generates an output for an N-bit binary code for each cycle of the clock signal CLK1.

The output 104 has a width of M bits for providing M-bit control codes to the output network 106. As described herein, the output 104 drives transistor switches in the output network 106. In an example, the output network 106 includes current-mode logic (CML) transistor switches, and the output 104 comprises a differential output. In another example, the output network 106 includes complementary metal oxide semiconductor (CMOS) transistor switches, and the output 104 comprises a single ended output.

The output network 106 is coupled to the output 104 of the decoder 102. The output network 106 also includes a clock port 110 configured to receive a clock signal (CLK2). The output network 106 includes output cells $108_1$ through $108_M$ (collectively referred to as "output cells 108"). Each of the output cells 108 includes a clock port configured to receive the clock signal CLK2. Each of the output cells 108 receives a respective bit slice of the output 104. Each of the output cells 108 further includes a data modulator 109. The data modulator 109 is operable to modulate the input data at the frequency of CLK2 to shift the data into higher Nyquist zones. By selecting the rate of CLK2, the DAC 100 can directly transition from digital to RF, obviating the need for additional components, such as mixers. The output network 106 includes an analog output 114, which comprises the sum of the outputs of the output cells 108.

In operation, each of the output cells 108 drives the load circuit 112 based on the control codes output by the decoder 102. The level of the analog output varies based on the number of output cells 108 driving the load circuit 112, which in turn is controlled by the control codes output by the decoder 102. Through operation of the data modulator 109 in each of the output cells 108, the analog output of the output network 106 includes sum and difference components centered at a carrier frequency. An exemplary spectrum of the analog output is described below.

The load circuit 112 is coupled to the analog output 114. The load circuit 112 can include various types of circuits for sourcing or sinking the analog output. For example, the load circuit 112 can include resistor loads that convert analog output current to an analog output voltage. In another example, the load circuit 112 can include active circuit(s), such as current amplifier(s) for amplifying the analog output current or trans-resistance amplifier(s) for amplifying and converting the analog output current to an analog output voltage.

The DAC 100 is one example DAC in which the output cells 108 described herein can be used. The decoder 102 can employ various decoding schemes, including binary weighted coding, thermometer coding (unary weighted), or a combination thereof (e.g., a segmented DAC). Regardless of the input and particular coding used, the decoder 102 generally outputs a data signal used to drive the output cells 108 in the output network 106.

Figure 2:
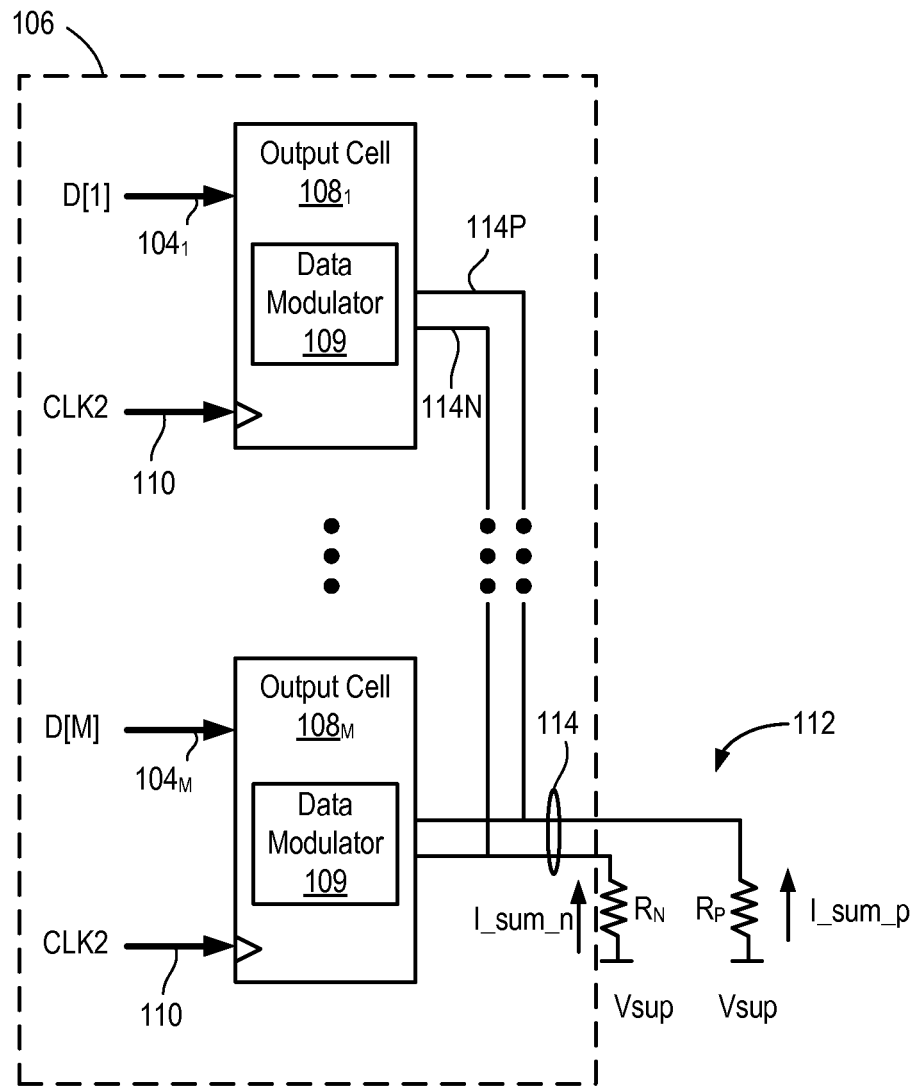
FIG. 2 is a block diagram depicting an example of the output network that can be used in a DAC, such as the DAC shown in FIG. 1.

FIG. 2 is a block diagram depicting an example of the output network 106 that can be used in a DAC, such as the DAC 100 shown in FIG. 1. As described above, the output network 106 comprises the output cells $108_1$ through $108_M$. The output cell $108_1$ receives the first bit slice of each of the output 104 (referred to as "D[1]" for the first bit). In general, the kth output cell $108_k$ receives the kth bit slice of the output 104. Each of the output cells 108 also receives the clock signal (CLK2).

Each of the output cells 108 is switched to steer current to either a positive end 114P or negative end 114N of the analog output 114. The switching is based on the control code input (D[k]) and the clock input (CLK2). In the example, the load circuit 112 comprises a resistor $R_P$ coupled to the positive end 114P, and a resistor $R_N$ coupled to the negative end 114N. In the example shown, the resistors $R_P$ and $R_N$ are coupled to a supply voltage (Vsup) and the output network 106 sinks a current I_sum_n on the negative end 114N and a current I_sum_p on the positive end 114P of the analog output 114. In another example, the resistors $R_P$ and $R_N$ can be coupled to a reference voltage (e.g., electrical ground) and the output network 106 can supply the current I_sum_n and the current I_sum_p.

Figure 3:
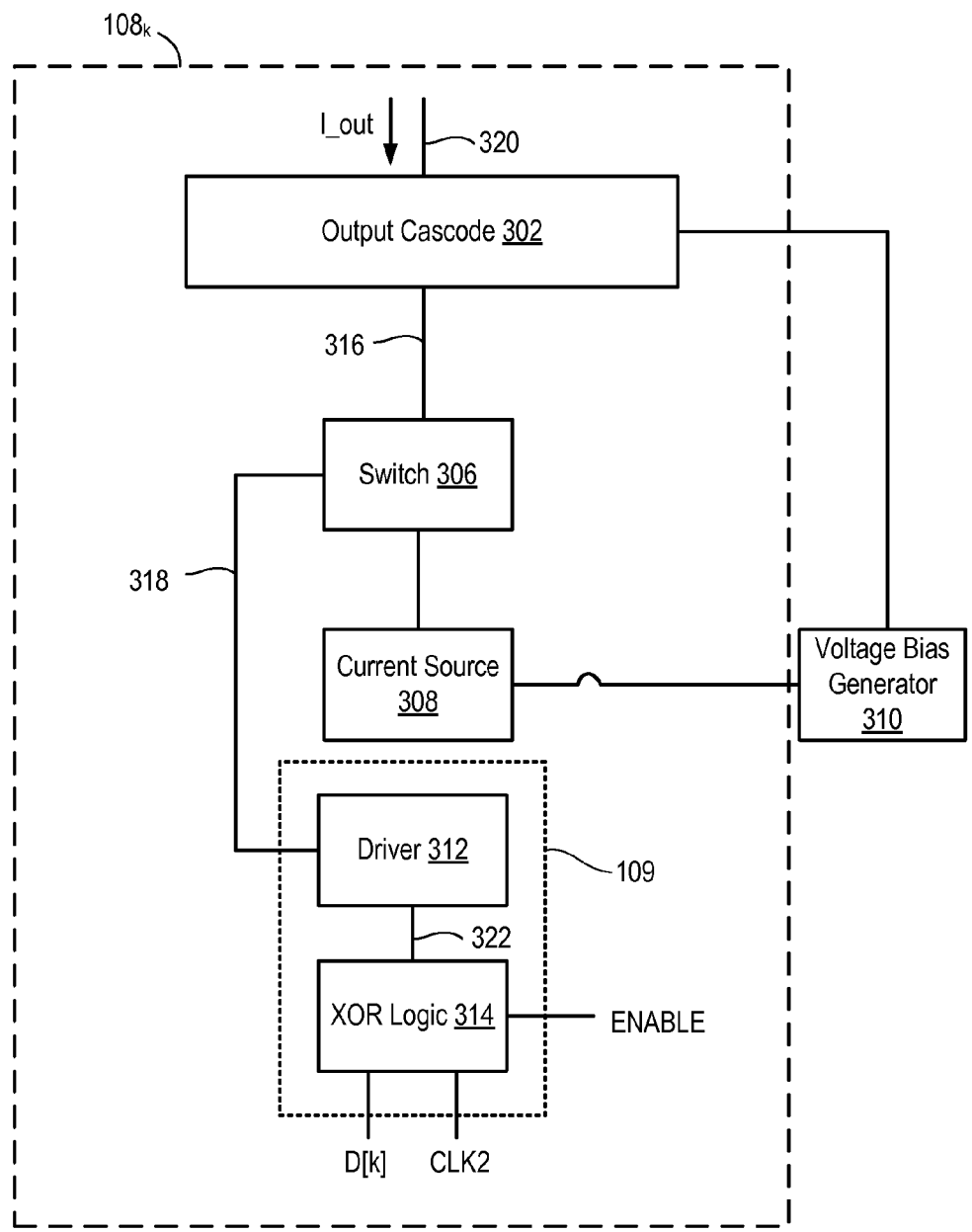
FIG. 3 is a block diagram depicting an example of an output cell.

FIG. 3 is a block diagram depicting an example of an output cell $108_k$ used in the output network 106 shown in FIG. 2 (where k∈{1 . . . M}). The output cell $108_k$ comprises an output cascode 302, a switch 306, a current source 308, and the data modulator 109. The output cascode 302 and the current source 308 receive bias voltage from a voltage bias generator 310. The switch 306 selectively couples the output cascode 302 and the current source 208 based on an output 318 of the data modulator 109. The output cascode 302 drives an output 320, which in the present example sinks a current I_out. The output cascode 302 is optional and can be used to shield the analog output 114 from parasitic capacitance of the output cell 108.

The data modulator 109 includes a driver 312 and exclusive OR (XOR) logic 314. The XOR logic 314 includes a pair of inputs coupled to receive a data bit slice D[k] and the clock signal CLK2. The XOR logic 314 also includes a control input coupled to receive an enable signal. The enables signal determines whether the XOR logic 314 performs an XOR's D[k] and CLK2, or whether the XOR logic 314 passes D[k]. An output 322 of the XOR logic 314 provides the XOR of D[k] and CLK2 or D[k], depending on the state of the enable signal. The output 318 of the driver 312 is coupled to control the switch 306. In an example, the XOR logic 314 includes an XOR gate having an enable input. In general, the XOR logic 314 comprises combinatorial logic operable to perform an XOR operation based on state of the enable signal.

Figure 4:
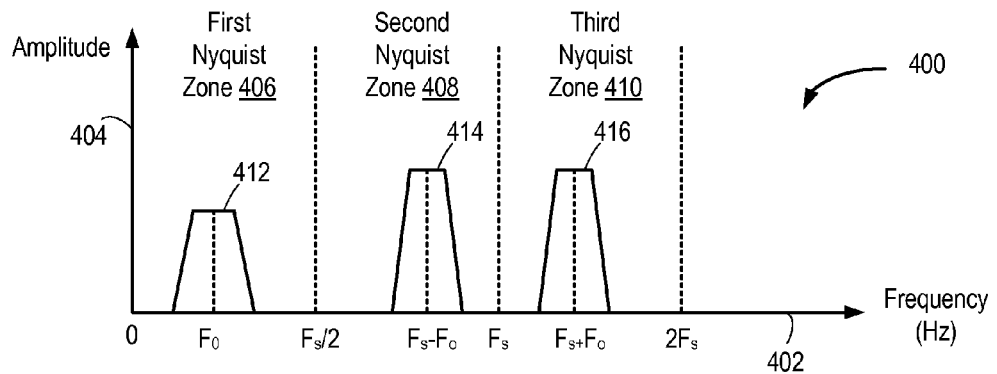
FIG. 4 is a graph depicting an output spectrum of the DAC of FIG. 1.

In operation, XORing the clock signal CLK2 with the data D[k] modulates the data D[k] into the higher Nyquist zones. FIG. 4 is a graph 400 depicting an output spectrum of the DAC 100. The graph 400 includes an axis 402 representing frequency in Hertz (Hz), and an axis 404 representing amplitude in arbitrary units. The graph 400 shows a first Nyquist zone 406, a second Nyquist zone 408, and a third Nyquist zone 410. The bandwidth of the first Nyquist zone 406 is between 0 and $F_s/2$. The bandwidth of the second Nyquist zone 408 is between $F_s/2$ and $F_s$. The bandwidth of the third Nyquist zone 410 is between $F_s$ and $2F_s$.

As shown by 412, the baseband signal is located in the first Nyquist zone 406 centered at a frequency $F_0$. As shown by 414, a lower side band of the RF signal is located in the second Nyquist zone 408 centered at a frequency $F_s$-$F_0$. A shown by 416, an upper side band of the RF signal is located in the third Nyquist zone 410 centered at a frequency $F_s$+$F_0$. Thus, the DAC 100 transfers the power of the baseband signal in the first Nyquist zone 406 into the second and third Nyquist zones 408 and 410. Power can also be transferred to higher Nyquist zones, but the dominant transfer is to the second and third Nyquist zones.

As shown in FIG. 3, the output cell $108_k$ can be implemented using combinatorial logic upstream of the current steering switches. Compared to previous current steering cell architectures, the output cell $108_k$ requires fewer drivers/switches and requires lower power and smaller implementation area. The modulation scheme inherently self-synchronizes the data with the clock. The scheme is compatible with deed sub-micron processes. Further, the output cell $108_k$ removes the need for a mixer in the signal chain.

Figure 5:
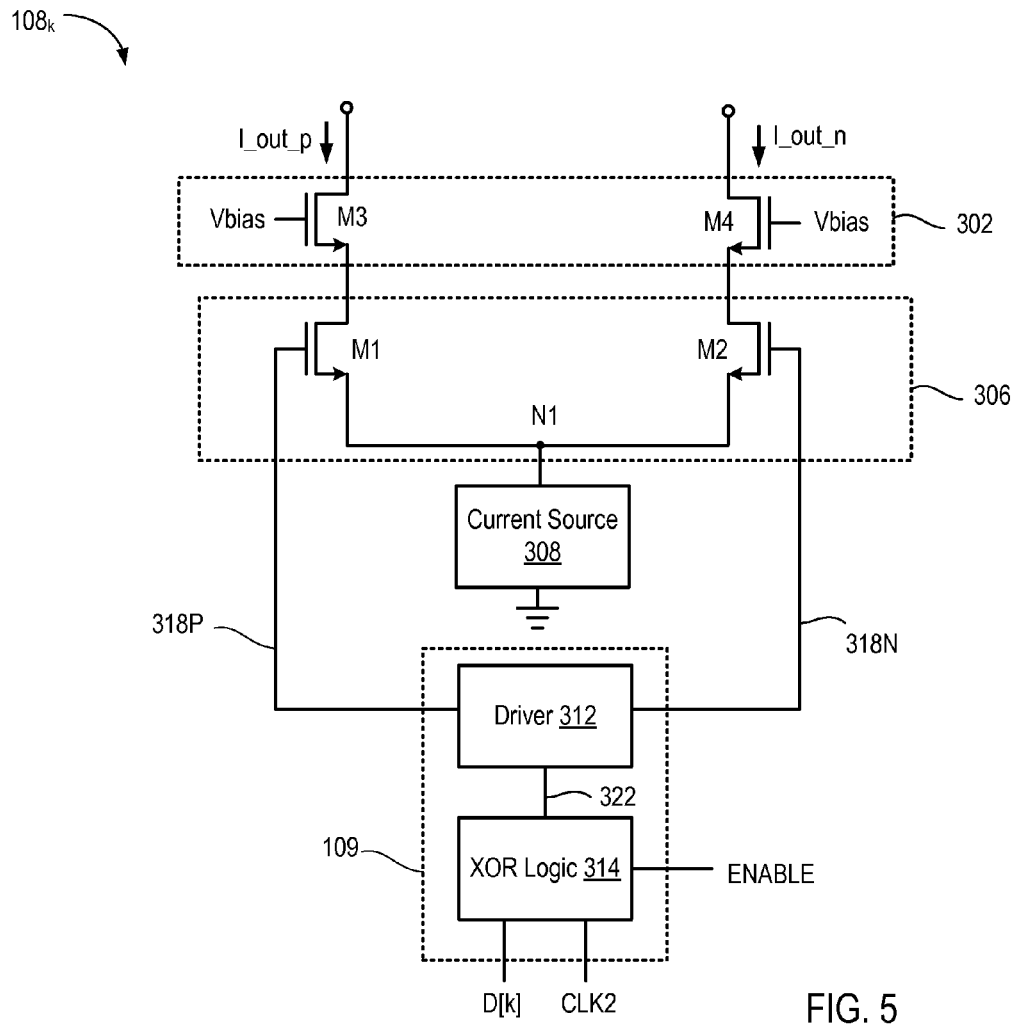
FIG. 5 is a schematic diagram depicting a more detailed example of an output cell.

FIG. 5 is a schematic diagram depicting a more detailed example of the output cell $108_k$. In general, the output cell $108_k$ comprises a plurality of n-channel field effect transistors (FETs), such as n-type metal oxide semiconductor FETs (n-type MOSFETS, also referred to as NMOS transistors) or the like. The switch 306 comprises a source-coupled transistor pair that includes the transistor M1 and the transistor M2. The sources of the transistors M1 and M2 are coupled to the node N1, which is in turn coupled to the current source 308. The drain of the transistor M1 is coupled to a source of a transistor M3, and the drain of the transistor M2 is coupled to a source of a transistor M4. A gate of the transistor M1 is coupled to an output 318P of the driver 312, and the gate of the transistor M2 is coupled to an output 318N of the driver 312. The output 318P is a positive end of a differential output of the driver 312, and the output 318N is a negative end of the differential output of the driver 312. The transistors M3 and M4 are part of the output cascode 302. Gates of the transistors M3 and M4 receive a bias voltage (Vbias). The drain current of the transistor M3 is the output current I_out_p, and the drain current of the transistor M4 is the output current I_out_n. The output cell 108 operates as described above with respect to FIG. 3.

Although the output cell $108_k$ has been described as include a switch with n-type MOSFETS (current sink implementation), other examples of the output cell $108_k$ can include a switch implemented using p-channel FETs, such as p-type MOSFETS (current source implementation). Further, the output cell $108_k$ has been described as being responsive to a differential input (e.g., a current-mode logic (CML) implementation). It is to be understood that the output cell $108_k$ can also be implemented with a single-ended input such as in a pure CMOS implementation.

Figure 6:
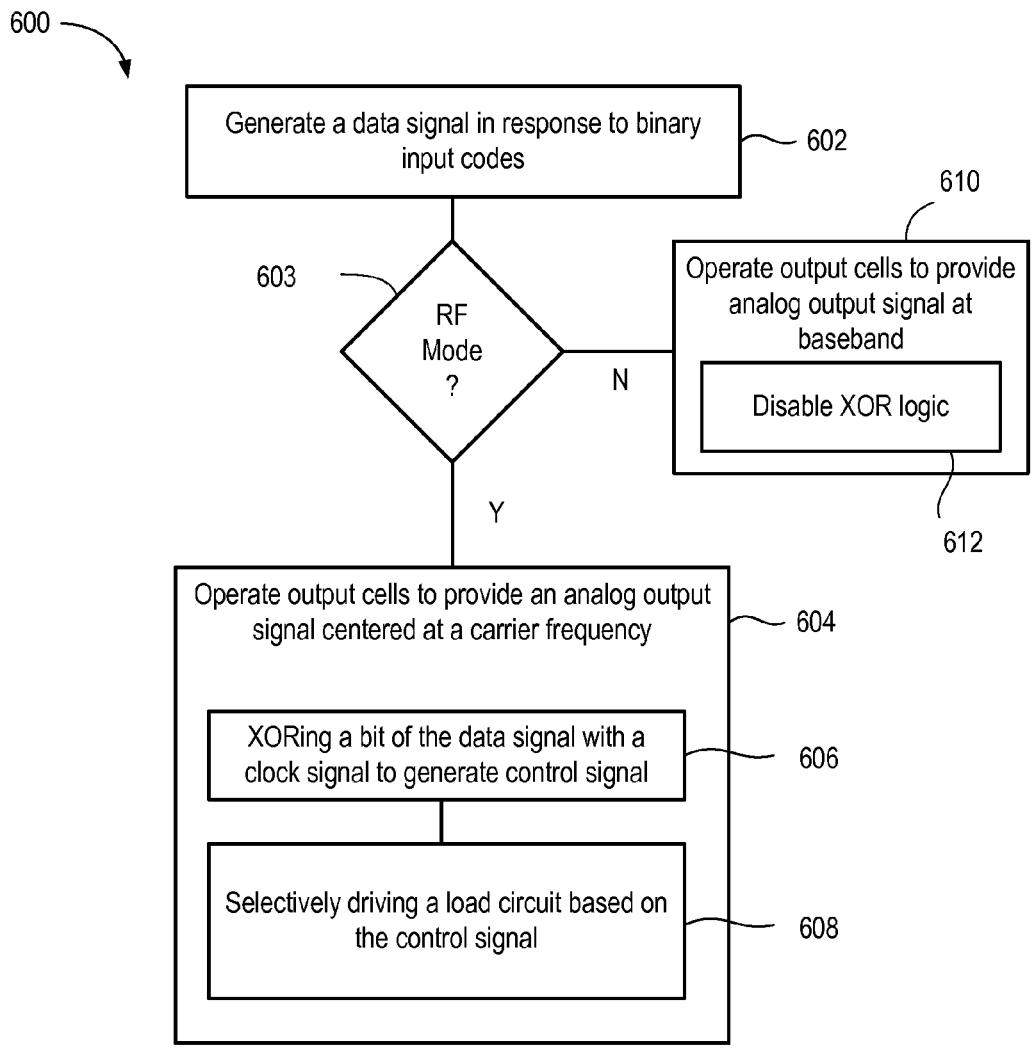
FIG. 6 is a flow diagram depicting an example of a method of digital-to-analog conversion.

FIG. 6 is a flow diagram depicting an example of a method 600 of digital-to-analog conversion. The method 600 may be understood with reference to FIGS. 1 through 5 above. The method 600 begins at block 602, where the decoder 102 generates a data signal response to binary input codes. At block 603, a determination is made whether the output cells 108 operate in baseband or RF mode. If in baseband mode, the method 600 proceeds to block 610. At block 610, output cells 108 provide an analog output signal at baseband (i.e., without a carrier frequency). The block 610 can include a block 612, where the XOR logic 314 is disabled in the baseband mode.

If in RF mode at block 603, the method 600 proceeds to block 604. At block 604, output cells 108 provide an analog output signal centered at a carrier frequency. The block 604 can include blocks 606 through 608. At block 606, for each output cell 108, the output cell 108 XOR's a bit of the data signal with a clock signal to generate a control signal. At block 608, the output cell 108 selectively drives the load circuit 112 based on the control signal.

Figure 7:
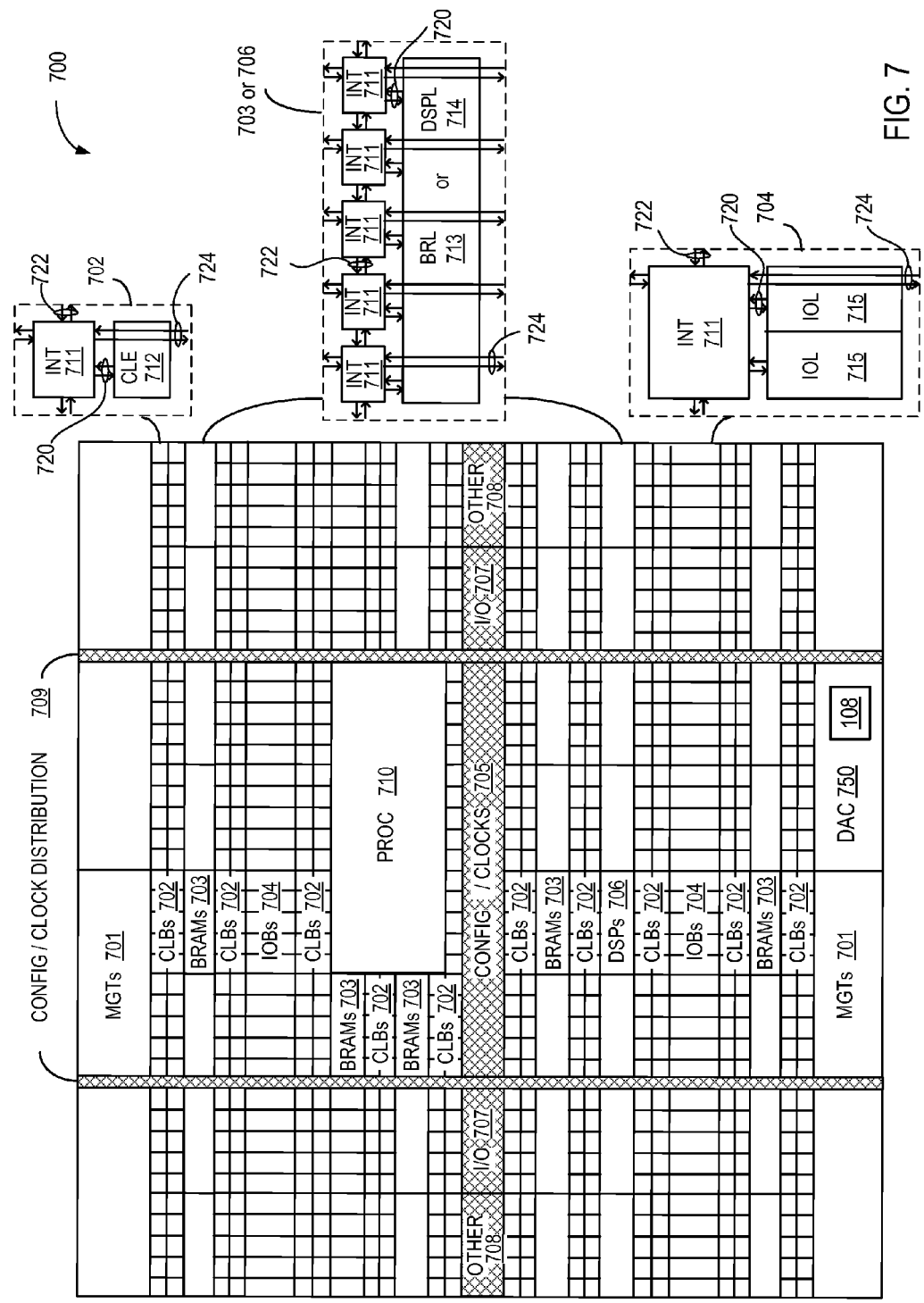
FIG. 7 illustrates an example architecture of an FPGA.

The output cells 108 described herein can be used in various DAC applications, including in DACs on various types of integrated circuits. For example, the output cells 108 can be used in a DAC on a programmable integrated circuit, such as a field programmable gate array (FPGA). FIG. 7 illustrates an example architecture of an FPGA 700 that includes a large number of different programmable tiles including multi-gigabit transceivers ("MGTs") 701, configurable logic blocks ("CLBs") 702, random access memory blocks ("BRAMs") 703, input/output blocks ("IOBs") 704, configuration and clocking logic ("CONFIG/CLOCKS") 705, digital signal processing blocks ("DSPs") 706, specialized input/output blocks ("I/O") 707 (e.g., configuration ports and clock ports), and other programmable logic 708 such as digital clock managers, analog-to-digital converters, system monitoring logic, and so forth. Some FPGAs also include dedicated processor blocks ("PROC") 710.

In some FPGAs, each programmable tile can include at least one programmable interconnect element ("INT") 711 having connections to input and output terminals 720 of a programmable logic element within the same tile, as shown by examples included at the top of FIG. 7. Each programmable interconnect element 711 can also include connections to interconnect segments 722 of adjacent programmable interconnect element(s) in the same tile or other tile(s). Each programmable interconnect element 711 can also include connections to interconnect segments 724 of general routing resources between logic blocks (not shown). The general routing resources can include routing channels between logic blocks (not shown) comprising tracks of interconnect segments (e.g., interconnect segments 724) and switch blocks (not shown) for connecting interconnect segments. The interconnect segments of the general routing resources (e.g., interconnect segments 724) can span one or more logic blocks. The programmable interconnect elements 711 taken together with the general routing resources implement a programmable interconnect structure ("programmable interconnect") for the illustrated FPGA.

In an example implementation, a CLB 702 can include a configurable logic element ("CLE") 712 that can be programmed to implement user logic plus a single programmable interconnect element ("INT") 711. A BRAM 703 can include a BRAM logic element ("BRL") 713 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 706 can include a DSP logic element ("DSPL") 714 in addition to an appropriate number of programmable interconnect elements. An IOB 704 can include, for example, two instances of an input/output logic element ("IOL") 715 in addition to one instance of the programmable interconnect element 711. As will be clear to those of skill in the art, the actual I/O pads connected, for example, to the I/O logic element 715 typically are not confined to the area of the input/output logic element 715.

In the pictured example, a horizontal area near the center of the die (shown in FIG. 7) is used for configuration, clock, and other control logic. Vertical columns 709 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 710 spans several columns of CLBs and BRAMs.

The processor block 710 can include various components ranging from a single microprocessor to a complete programmable processing system of microprocessor(s), memory controllers, peripherals, and the like.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 7 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements. The FPGA 700 can include a DAC 750 having output cells 108.

While the foregoing is directed to specific examples, other and further examples may be devised without departing from the basic scope thereof, and the scope thereof is determined by the claims that follow.

What is claimed is:

1. A current steering circuit for a digital-to-analog converter (DAC), comprising:
    a source-coupled transistor pair responsive to a differential gate voltage;
    a current source coupled to the source-coupled transistor pair operable to source a bias current;
    a load circuit coupled to the source-coupled transistor pair operable to provide a differential output voltage;
    a driver having a first input, a second input, and a differential output, the differential output providing the differential gate voltage; and
    combinatorial logic having a data input, a clock input, a true output, and a complement output, the true output and the complement output respectively coupled to the first input and the second input of the driver, the combinatorial logic operable to exclusively OR a data signal on the data input and a clock signal on the clock input.

2. The current steering circuit of claim 1, wherein the combinatorial logic includes an enable input operable to receive an enable signal, the combinatorial logic either performing the exclusive OR of the data signal and the clock signal or passing the data signal based on state of the enable signal.

3. The current steering circuit of claim 1, further comprising:
    an output transistor pair coupled between the source-coupled transistor pair and the load circuit.

4. The current steering circuit of claim 1, wherein the transistors in the source-coupled transistor pair comprise n-channel metal oxide field effect transistors (MOSFETs).

5. The current steering circuit of claim 1, wherein the transistors in the source-coupled transistor pair comprise p-channel metal oxide field effect transistors (MOSFETs).

6. The current steering circuit of claim 1, wherein the data signal comprises a bit of a digital code input to the DAC.

7. The current steering circuit of claim 1, wherein the combinatorial logic comprises an exclusive OR gate.

8. A digital-to-analog converter (DAC), comprising:
    a decoder operable to output a data signal in response to binary input codes;
    a plurality of output cells coupled between the decoder and a load circuit to provide an analog output signal centered at a carrier frequency, each of the plurality of output cells comprising:
        a switch circuit coupled to the load circuit;
        a driver having an input and an output, the output operable to control the switch; and
        combinatorial logic having a data input operable to receive a respective bit of the data signal, a clock input operable to receive a clock signal, and an output, coupled to the input of the driver, the combinatorial logic operable to exclusively OR the data input and the clock input.

9. The DAC of claim 8, wherein the combinatorial logic includes an enable input operable to receive an enable signal, the combinatorial logic either performing the exclusive OR of the data input and the clock input or passing the data input based on state of the enable signal.

10. The DAC of claim 8, wherein the switch comprises a source-coupled transistor pair responsive to a differential gate voltage and a bias current, and wherein the output of the driver is a differential output providing the differential gate voltage.

11. The DAC of claim 10, wherein the output of the combinatorial logic comprises a true output and a complement output.

12. The DAC of claim 10, wherein each of the plurality of output cells further comprises:
    an output transistor pair coupled between the source-coupled transistor pair and the load circuit.

13. The DAC of claim 10, wherein the transistors in the source-coupled transistor pair comprise n-channel metal oxide field effect transistors (MOSFETs).

14. The DAC of claim 10, wherein the transistors in the source-coupled transistor pair comprise p-channel metal oxide field effect transistors (MOSFETs).

15. The DAC of claim 10, wherein the combinatorial logic comprises an exclusive OR gate.

16. A method of digital-to-analog conversion, comprising:
    generating a data signal in response to binary input codes;
    operating a plurality of output cells to provide an analog output signal centered at a carrier frequency, where each of the plurality of output cells is operated by:
        exclusively ORing a respective bit of the data signal and a clock signal to generate a control signal; and
        selectively driving a load circuit based on the control signal.

17. The method of claim 16, wherein the operation of exclusively ORing the respective bit of the data signal and the clock signal is performed by combinatorial logic, and wherein the method further comprises enabling the combinatorial logic to perform the operation of exclusively ORing.

18. The method of claim 16, wherein the operation of selectively driving comprises:
    coupling the control signal to a driver; and
    coupling output of the driver to a switch coupled to the load circuit.

19. The method of claim 18, wherein the switch comprises a source-coupled transistor pair, and wherein the output of the driver comprises a differential gate voltage coupled to the source-coupled transistor pair.

20. The method of claim 19, wherein the operation of selectively driving comprises steering a current through load circuit and the source-coupled transistor pair based on the differential gate voltage.

* * * * *